United States Patent [19]

Takeda et al.

[11] 3,821,656

[45] June 28, 1974

[54] TRANSISTOR CIRCUIT FOR THE DRIVER STAGE OF A CLASS B AMPLIFIER

[75] Inventors: Masashi Takeda, Isehara; Masafumi Kikuchi, Atsugi, both of Japan

[73] Assignee: Sony Corporation, Tokyo, Japan

[22] Filed: Oct. 3, 1972

[21] Appl. No.: 294,617

[30] Foreign Application Priority Data

Oct. 12, 1971 Japan .............................. 46-80432
Oct. 12, 1971 Japan .............................. 46-80433

[52] U.S. Cl. .................... 330/15, 330/22, 330/30 D
[51] Int. Cl. .............................................. H03f 3/26
[58] Field of Search ...... 307/235; 330/15, 22, 30 D, 330/40, 69

[56] References Cited

UNITED STATES PATENTS 3,054,910 9/1962 Bothwell .............................. 307/15
3,401,350 9/1968 Barton et al. .................... 330/30 D

*Primary Examiner*—Herman Karl Saalbach
*Assistant Examiner*—Lawrence J. Dahl
*Attorney, Agent, or Firm*—Hill, Gross, Simpson, Van Santeen, Steadman, Chiara & Simpson

[57] ABSTRACT

A differential amplifier employing a pair of transistors whose bases are biased differentially with respect to each other so that when used for a driver in a class B amplifier a dynamic range is obtained which is approximately twice the width of prior art differential amplifiers.

5 Claims, 8 Drawing Figures

TRANSISTOR CIRCUIT FOR THE DRIVER STAGE OF A CLASS B AMPLIFIER

BACKGROUND OF THE INVENTION

Differential amplifiers are generally used for a transistor circuit in a radio receiver, a television receiver, etc. Each base of the transistors comprising the differential amplifier is biased at the same dc voltage to be operated as a class A amplifier, so that matched currents flow through the pair of transistors. If the differential amplifiers are used for drivers in a class B amplifier, the dynamic range of the drivers is limited because a half cycle of the output signal from the drivers is missing to drive an output stage of class B amplifier.

SUMMARY OF THE INVENTION

In a differential amplifier of this invention, each base of a pair of transistors is biased differentially respectively, so that if the differential amplifier is used for a driver in a class B amplifier, a dynamic range of the driver is twice the width of prior art differential amplifiers.

It is an object of the present invention to provide a novel differential amplifier which includes a pair of transistors whose bases are differentially biased by applying to the base of one transistor a bias substantially equal to the cut-off value thereof, and by applying to the base of the other transistor a bias which is different in value from that applied to the base of the first transistor.

Further details of the invention will be apparent from the description and the figures which relate to preferred embodiments of the invention and further developments thereof.

DESCRIPTION OF PREFERRED EMBODIMENTS

Figure 1:
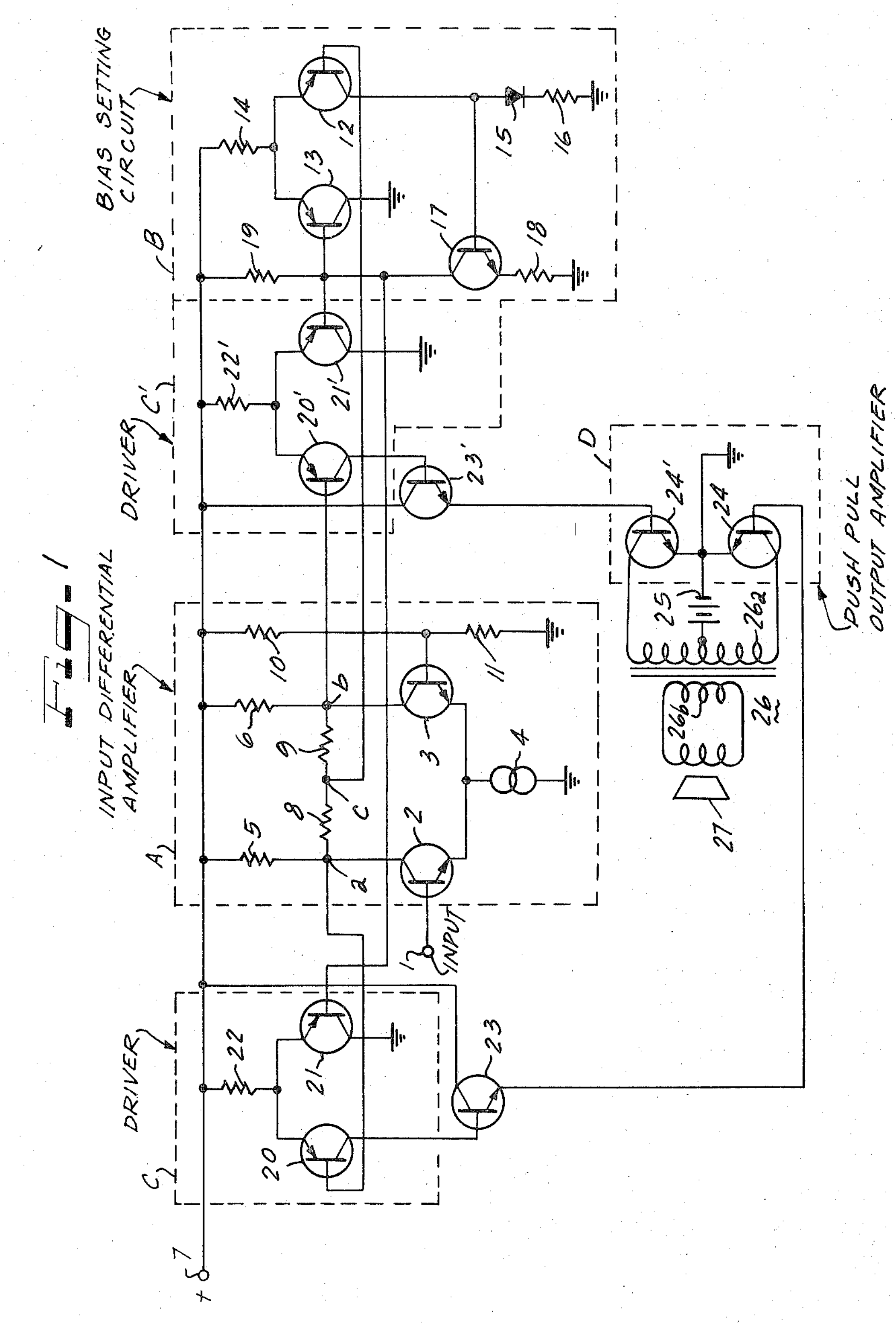
FIG. 1 is a schematic diagram of an audio frequency amplifier circuit illustrating a preferred embodiment of the present invention.

FIG. 1 illustrates an audio frequency amplifier embodying the teachings of the present invention. For convenience, different portions of the amplifier have been identified with broken line boxes A, B, C, C′ and D. Portion A is a conventional input differential amplifier, Portion B is the bias setting circuit, Portions C and C′ are the two drivers, and Portion D is the push-pull output amplifier.

Figure 2A:
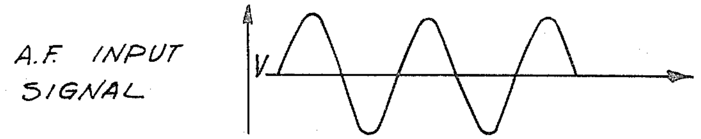
FIG. 2A shows the voltage of the audio frequency input signal as a function of time.
Figure 2B:
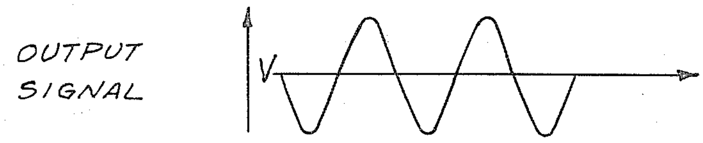
FIG. 2B shows the voltage output signals as a function of time.
Figure 2C:
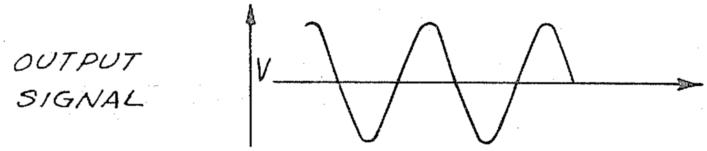
FIG. 2C shows the voltage output signals as a function of time.
Figure 2D:
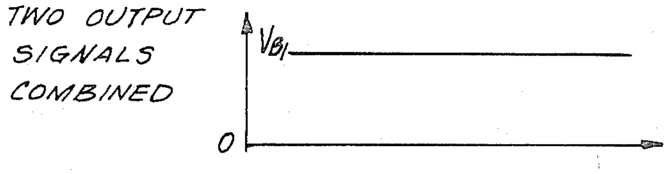
FIG. 2D shows the two output signals combined.

As shown in FIG. 1, the input circuit A is a conventional differential amplifier wherein an AF signal input terminal 1 is connected to a base of an npn transistor 2. The emitter of the transistor 2 is connected to the emitter of an npn transistor 3. The connecting point between the emitters is grounded through a constant current source 4. Each collector of the transistors 2 and 3 is connected to a positive source terminal 7 through resistors 5 and 6, respectively. Resistors 8 and 9 are connected in series between the collectors. Resistors 10 and 11 are connected in series between the terminal 7 and ground, and the connecting point between the resistors 10 and 11 is connected to the base of the transistor 3 to supply a predetermined bias thereto. In this circuit A, when an AF signal as shown in FIG. 2A is applied to the input terminal 1, output signals having voltage wave forms as shown in FIGS. 2B and 2C are obtained at points *a* and *b* respectively. The output signals are opposite in phase to each other so that a constant voltage is obtained at a point *c* shown in FIG. 2D.

The bias setting circuit B has a pair of pnp transistors 12 and 13 whose emitters are connected each other, the connecting point between emitters being connected to the terminal 7 through a resistor 14. The collector of the transistor 13 is grounded, while the collector of the transistor 12 is grounded through a diode 15 and a resistor 16. The collector of the transistor 12 is connected to the base of an npn transistor 17. The emitter of the transistor 17 is grounded through a resistor 18 and the collector of the transistor 17 is connected to the base of the transistor 13, and is also connected to the terminal 7 through a resistor 19. The base of the transistor 12 is connected to the point *c* in the input circuit A so that a constant bias voltage $V_{B1}$ is always applied to the base.

When the bias voltage $V_{B1}$ is applied to the base of the transistor 12, a collector current $I_1$ flows through the transistor 12, the diode 15 and the resistor 16 to produce a voltage $V_D$ between the series circuit of the diode 15 and resistor 16. The voltage $V_D$ is applied to the base of the transistor 17 so that a collector current $I_3$ defined by a value of the resistor 18 and the voltage $V_D$ flows through the transistor 17. Therefore, a constant bias voltage $V_{B2}$ is obtained at the base of the transistor 13.

If the values of the resistors 16, 18 and 19 are selected suitably, a difference voltage $V_{BO} = V_{B1} - V_{B2}$ is freely determinable.

The diode 15 is used for reducing a voltage $V_D$, not to increase the bias voltage $V_{B2}$, when the base current of the transistor 17 increases due to a temperature effect.

The transistors 12 and 13 form a differential amplifier and the current $I_2$ through the transistor 13 is complimentary to the current $I_3$, and hence the bias voltage $V_{B2}$ does not vary even if the current $I_3$ tends to increase due to a temperature effect.

The driver C (or C′) includes a pair of pnp transistors 20 and 21 (or 20′ and 21′) whose emitters are connected to each other and to the terminal 7 through a resistor 22 (or 22′). The collector of the transistor 21 (or 21′) is grounded while the base of the transistor 21 (or 21′) is connected to the base of the transistor 13 to apply the bias voltage $V_{B2}$. The base of the transistor 20 (or 20′) is connected to the point *a* (or the point *b*). The transistors 20 and 21 (or 20′ and 21′) form a differential amplifier.

Voltages at the points *a* and *b* are equal to the voltage $V_{B1}$ at the point *c* when no input signal is applied to the input circuit A. Therefore, a bias voltage of $V_{B1}$ is supplied to each of the bases of the transistors 20 and 20′ and is selected substantially equal to the cut-off value, while a bias voltage of $V_{B2}$ is selected substantially equal to the saturation value.

An output terminal of the driver C (or C') that is, the collector of the transistor 20 (or 20') is connected to the base of an npn transistor 23 (or 23') constituting a current amplifier. A collector of the transistor 23 (or 23') is connected to the terminal 7. The emitters of the transistors 23 and 23' are connected respectively to the bases of the transistors 24 and 24' and thereby form a push-pull output amplifier.

The emitters of the transistors 24 and 24' are coupled with a primary winding 26*a* of transformer 26. A midpoint of the primary winding is connected to a positive terminal of a dc source 25 and the negative terminal of the source 25 is grounded as well as the emitters of the transistors 24 and 24'. A secondary winding 26*b* of the transformer 26 is coupled to the voice coil of a speaker 27.

When an input signal is applied to the input terminal 1, opposite phase signals are applied to the bases respectively of the transistors 20 and 20' from the points *a* and *b*, respectively. When the input signal is an alternating signal, the positive half of the signal is amplified by the driver C and the negative half of the signal is amplified by the driver C'. The output signals from the drivers C and C' are then amplified by the push-pull output amplifier D to reproduce a sound.

In this case the drivers C and C' are used as a class B amplifier so that the dynamic range thereof is substantially twice the width of a class A amplifier.

When no signal is applied to the input terminal 1, no collector current flows wither through the transistor 20 (or 20') or through the output transistor 24 (or 24'). Therefore, the power loss of the output transistors 24 and 24' is nearly zero when no signal is applied to the input terminal 1.

Figure 3:
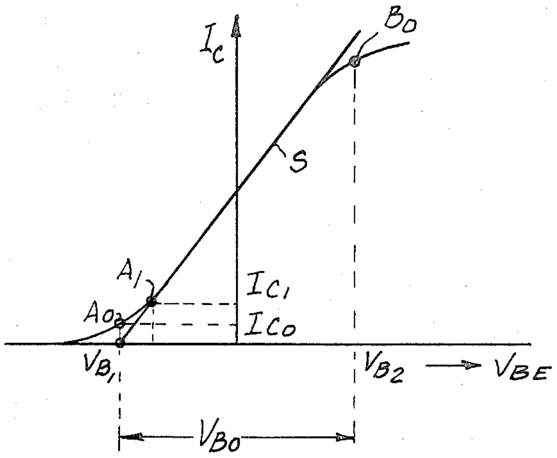
FIG. 3 shows the $I_c$ vs. $V_{BE}$ curve of one of the transistors.

FIG. 3 shows the $I_c$ vs. $V_{BE}$ curve S of the transistor 20 (or 20'). In the above example, a collector current $I_c$ varies on the curve S between Ao to Bo. Due to a curve between Ao to A1, cross-over distortion is caused in the composite signal from the output amplifier. To eliminate crossover distortion, it is useful to bias the transistor 20 (or 20') to conduct a few milliamperes with no applied signal. Such bias, however, is disadvantageous since there is a slight power loss in the output transistors when no signal is applied thereto.

Figure 4:
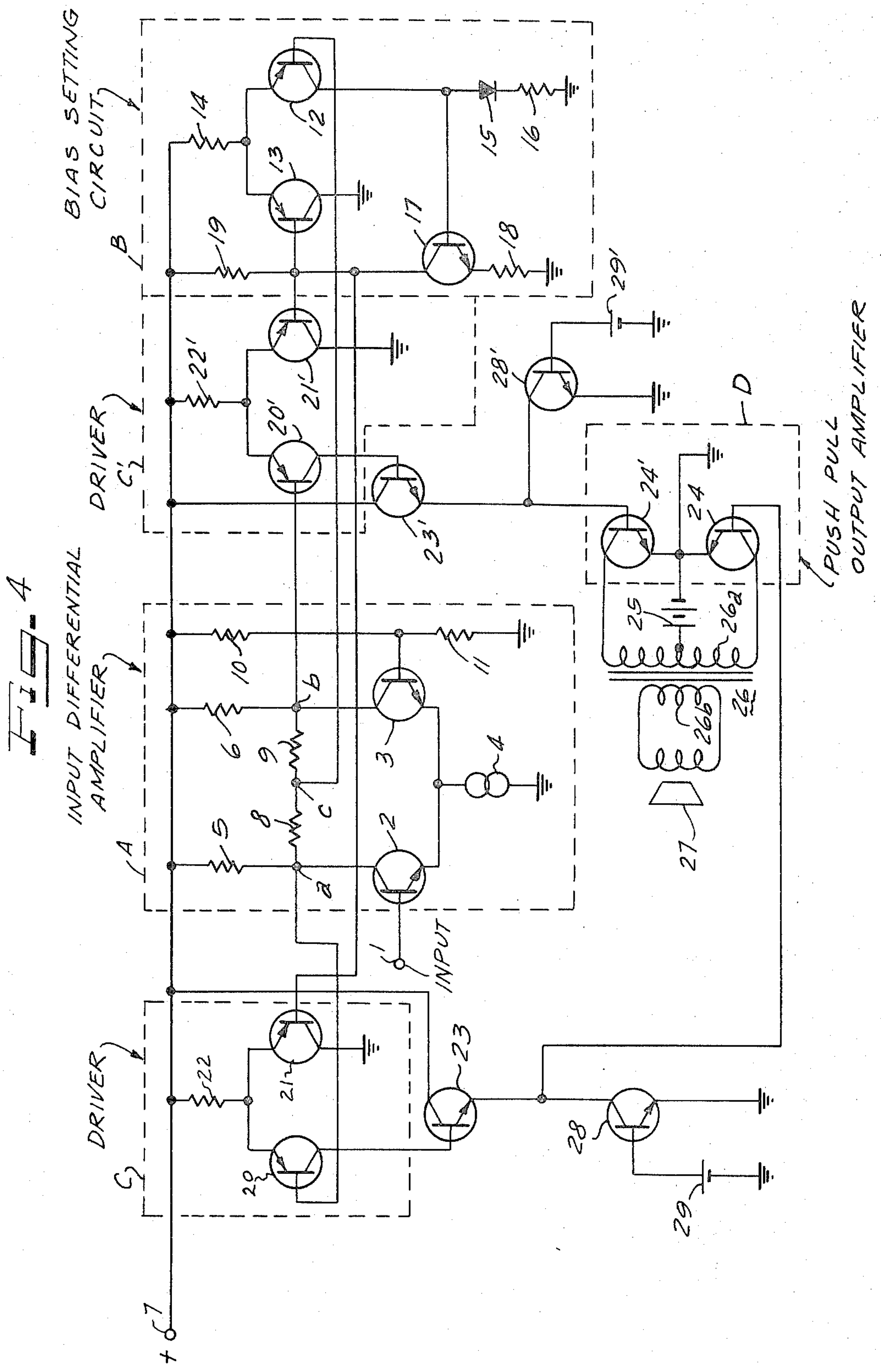
FIG. 4 is a schematic diagram of another embodiment of the present invention.

FIG. 4 shows another embodiment of this invention which reduces crossover distortion without increasing the power loss (or idling current) of the output transistors when no signal is applied to an AFamplifier.

In this circuit a constant current circuit consisting of an npn transistor 28 (or 28') and a dc source 29 (or 29') is connected between the emitter of the transistor 23 and ground.

When a current through the transistor 28 is adjusted to increase the collector current of the transistor 20 from $I_{co}$ to $I_{c1}$ crossover distortion is eliminated from the output signal. Further, in this case, increased collector current flows almost through the constant current circuit so that the collector current of the transistor 24 or 24' with no applied signal does not increase thereby, and hence there is no power loss in transistors 24 and 24'.

The constant current circuit may be connected between collector of the transistor 20 (or 20') and ground.

the transistors for the driver circuits may be npn transistors instead of pnp transistors.

In the above-mentioned examples, the emitters of transistors 20 and 21 are directly connected to each other and to the terminal 7 through a resistor 22. However, it is suitable for stabilizing the operation of the driver throughout a wide temperature range to provide two resistors 30 and 31 connected in series between emitters of transistors 20 and 21 and a connecting point of the resistors is connected to the terminal 7 through the resistor 22, as shown in FIG. 5.

The output amplifier comprising transistors 24 and 24' may be replaced with a single-ended push-pull amplifier without the transformer 26.

Figure 5:
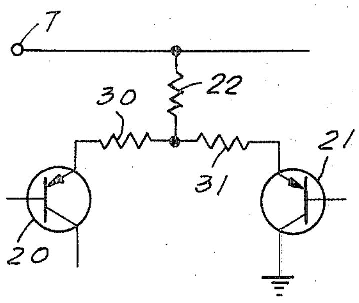
FIG. 5 is a modification of a portion of FIG. 4.

The circuits shown in FIGS. 1, 4 and 5 are suitable for formation as an integrated circuit because no condensers are employed.

Although the invention has been described in connection with the preferred embodiments, it is not to be so limited as changes and modifications may be made which are within the full intended scope of the invention as defined by the appended claims.

What is claimed is:

1. An audio frequency amplifier circuit comprising an input differential amplifier, two drive circuits connected to said input amplifier to be driven thereby, and to act in push-pull, each driver circuit comprising a driver differential amplifier, two current amplifiers connected respectively to the outputs of said driver differential amplifiers, a push-pull output circuit connected in a push-pull arrangement to said two current amplifiers, a bias setting circuit, said driver differential amplifiers each including a pair of transistors of the same impurity arrangement, including a base, a collector and an emitter, the bases of one of said pair of transistors connected to said bias setting circuit and receiving a first constant voltage, the bases of the other one of said pair of transistors connected to said bias setting circuit.

2. An audio frequency amplifier according to claim 1 in which the transistors of said driver circuits are pnp transistors, two pair of resistors, respectively connected between the emitters of each of said pairs of transistors and a source of positive d.c. potential connected, respectively to the junction point between said pairs of resistors.

3. An audio frequency amplifier according to claim 1 in which the transistors of each of said driver circuits are pnp transistors, each having a base, a collector and an emitter, a source of positive d.c. potential, each driver having a pair of resistors serially connected between said emitters of that driver, and a third resistor for each driver connected between the emitters thereof and said d.c. potential.

4. An audio frequency amplifier according to claim 1 including a d.c. source, said two current amplifiers each include a transistor having a base, a collector and an emitter, the collectors of which are connected to said d.c. source and the bases thereof being connected to outputs of its associated driver, and the emitters thereof being connected to said push-pull output circuit, two constant current circuits, one for each of said output amplifiers, each constant current circuit including an npn transistor having a base, a collector and an emitter, and another voltage source, the collector of each of said last mentioned transistors being connected to the emitter of its associated current amplifier; the emitter thereof being grounded, and the base thereof being connected through the positive side of said another voltage source to ground.

5. A transistor circuit comprising a first driver circuit having first and second pnp transistors each having a base, a collector and an emitter, a second driver circuit having a third and fourth pnp transistor each having a base, a collector and an emitter, a source of positive d.c. potential, the emitters of said first and second transistors being connected together and to said d.c. source, the emitters of said third and fourth transistors being connected together and to said d.c. source, and a.c. input signal source connected between an input point and ground, a differential input amplifier having fifth and sixth npn transistors each having a collector, a base and an emitter, a constant current source, the base of said fifth transistor being connected to one side of said input signal source, the emitter of said fifth and sixth transistors being connected together and through said constant current source to ground, a pair of resistors connected between the collectors of said fifth and sixth transistors, said collectors being connected to said d.c. source, the collector of said fifth transistor being connected to the base of said first transistor, the collector of said sixth transistor being connected to the base of said third transistor, the collectors of said second and fourth transistors being grounded, a bias setting circuit, said bias setting circuit supplying the same bias to the biases of said second and fourth transistors, and a push-pull output circuit connected to the collectors of said first and third transistors.

* * * * *